United States Patent [19]

Iizuka et al.

[11] Patent Number: 4,757,355
[45] Date of Patent: Jul. 12, 1988

[54] MASK STORING MECHANISM

[75] Inventors: Kazuo Iizuka, Yokohama; Yukio Tokuda, Kawasaki; Masao Kosugi, Yokohama, all of Japan

[73] Assignee: Canon Kabushiki Kaisha, Tokyo, Japan

[21] Appl. No.: 923,856

[22] Filed: Oct. 28, 1986

[30] Foreign Application Priority Data

Oct. 29, 1985 [JP] Japan ............................. 60-240455
Oct. 29, 1985 [JP] Japan ............................. 60-240456
Oct. 29, 1985 [JP] Japan ............................. 60-240459

[51] Int. Cl.$^4$ ............................................. G03B 27/62
[52] U.S. Cl. ..................................... 355/75; 355/53; 355/40; 355/72; 353/25
[58] Field of Search ................ 355/75, 53, 40, 72; 353/25

[56] References Cited

U.S. PATENT DOCUMENTS

| 4,557,595 | 12/1985 | Freundt ............................ 355/72 |
| 4,574,692 | 3/1986 | Wahli ............................... 355/40 |
| 4,602,865 | 7/1986 | Yamaguchi et al. ............... 355/40 |

Primary Examiner—Monroe H. Hayes
Attorney, Agent, or Firm—Fitzpatrick, Cella, Harper & Scinto

[57] ABSTRACT

A device for supplying masks to be used in a chamber having a wall, comprises an opening formed in the wall of the chamber, and a rotatable shelf disposed in the opening and for carrying thereon the masks. The rotatable shelf is coupled, by way of a rotational shaft, to a portion of the wall adjacent to the opening and the rotational shelf has a mask carrying portion which is rotationally movable, about the rotational shaft, through the opening to and from the inside of the chamber and from and to the outside of the chamber.

9 Claims, 9 Drawing Sheets

MASK STORING MECHANISM

FIELD OF THE INVENTION AND RELATED ART

This invention relates to a mask storing mechanism for storing masks usable with an exposure apparatus in a photolithographic process which is a part of a fine pattern manufacturing process.

In this Specification, the word "mask" means an original such as a photomask, reticle, etc., having a pattern to be transferred onto a workpiece such as, e.g. a semiconductor wafer. In some part of the following description, the word "reticle" will be used in place of the word "mask". However, the explanation in relation to the "reticle" directly applies to the case where a "photomask" or the like is used.

In the photolithographic process for the manufacture of semiconductor devices such as integrated circuits, patterns are formed on a wafer in various ways. For example, a mask having patterns of desired size to be reproduced on the wafer, is brought into intimate contact with the wafer and, thereafter, the mask and the wafer are illuminated so as to photoprint the patterns of the mask onto the wafer. As another example, one or more patterns, corresponding to one or more chips on the wafer and having a size several to ten times larger than the size to be reproduced, are formed on a reticle. By use of optical projection means, an image of the reticle pattern is projected onto the wafer in a reduced scale to photoprint the reduced image on the wafer. Usually, several or ten times of such pattern transfer processes are necessary for manufacture of one semiconductor device. More particularly, first, a first reticle for the first mask process is introduced into the exposure apparatus and the pattern transfer process using the first reticle is executed for each of a predetermined number (e.g. one hundred) of wafers. The wafers having been so processed are subsequently subjected, as desired, to etching, inpurity diffusion, formation of a conductive layer, an insulative layer and a semiconductive layer, as well as coating with a photoresist material. Then, the first reticle is replaced by a second reticle for the second mask process, and each of the wafers is subjected to the pattern transfer process using the second reticle. In similar manners, photolithographic pattern transfer processes using further reticles are repeatedly executed and, finally, desired patterns are formed on the wafers. The tendency to further miniaturization of the width of a line constituting the pattern of the integrated circuit, has enforced development of exposure apparatuses having high resolution and high accuracy. Along these trends and in order to assure that the exposure apparatus shows its true ability to thereby ensure an improved yield of semiconductor chips, the exposure apparatus as a whole is usually kept in a chamber to thereby protect the apparatus against dust or foreign particles. Also, by doing so, the wafers can be processed in an ambience of constant temperature and humidity. Plural reticles necessary for a series of pattern transfer processes are usually disposed on a predetermined station in the exposure apparatus within the chamber, and these reticles are supplied, one by one, to the exposure station in accordance with the sequence of the pattern transfer processes. When the series of pattern transfer processes using these reticles are completed, these reticles are replaced by another set of reticles prepared for the manufacture of another type of semiconductor devices. For the sake of replacement, an operator opens a door of the chamber and enters into the chamber. Then he or she takes out the reticles having been used and, thereafter, he or she places the new set of reticles at the predetermined station in the neighborhood of the exposure station.

Usually, each of such masks or reticles is kept in a mask cassette, and plural cassettes each containing one mask or reticle are disposed on the exposure apparatus in the chamber in a stacking fashion. A particular mask having a particular pattern, when it is desired to be used, is taken out from its cassette by a conveying mechanism having a mask handling hand and conveyed to the predetermined station close to the exposure station in the exposure apparatus. For loading/unloading of such mask cassettes into/from the exposure apparatus disposed in the chamber, an operator has to open the door of the chamber and enter into the chamber. That is, by the operator within the chamber, the mask cassettes are placed on or removed from a predetermined mask storing station which is defined on the exposure apparatus. The entrance through which the operator enters into and goes out from the chamber is usually provided from the necessity of maintenance of the exposure apparatus as a whole. Therefore, such entrance is of a large size. This leads to a possibility that dust or foreign particles enter into the chamber when the door of such access entrance is opened for the purpose of setting or replacement of the mask cassettes. Also, the temperature, the humiditiy, the flow of air within the chamber are adversely affected or disturbed. It requires a long time before resuming the stabilized ambience of the exposure apparatus. Before it is stabilized, the exposure apparatus can not be operated with the result that its productivity is degraded.

In conventional exposure apparatuses, the mask conveying mechanism as well as the mask cassettes are supported on the frame of the exposure apparatus within the chamber. Thus, when the number of the mask cassettes changes or any movable components of the mask conveying mechanism, such as the hand, is displaced at the time of conveyance of the cassette, the load and the center of gravity of the exposure apparatus changes. If this occurs, then it is possible that the optical axis of an optical system of the exposure apparatus inclines with the result that the focus position deviates, thus causing deterioration in pattern transfer accuracy. Also, where the exposure apparatus is provided with an automatic focusing system, such inclination of the optical axis directly leads to automatic stoppage of the exposure operation. That is, the photoprinting process is discontinued. This is very disadvantageous.

SUMMARY OF THE INVENTION

It is accordingly a primary object of the present invention to provide a mask storing system which allows easy loading/unloading of masks without disturbing the ambience of an exposure apparatus disposed in a chamber.

It is another object of the present invention to provide a mask storing system which allows easy introduction or loading of masks from the outside of a chamber in which an exposure apparatus is disposed.

It is a further object of the present invention to provide a mask storing system which avoids adverse effects, upon an exposure apparatus, of any changes in the load and the center of gravity due to any change in the number of mask cassettes and displacement of any movable component such as a mask handling hand.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
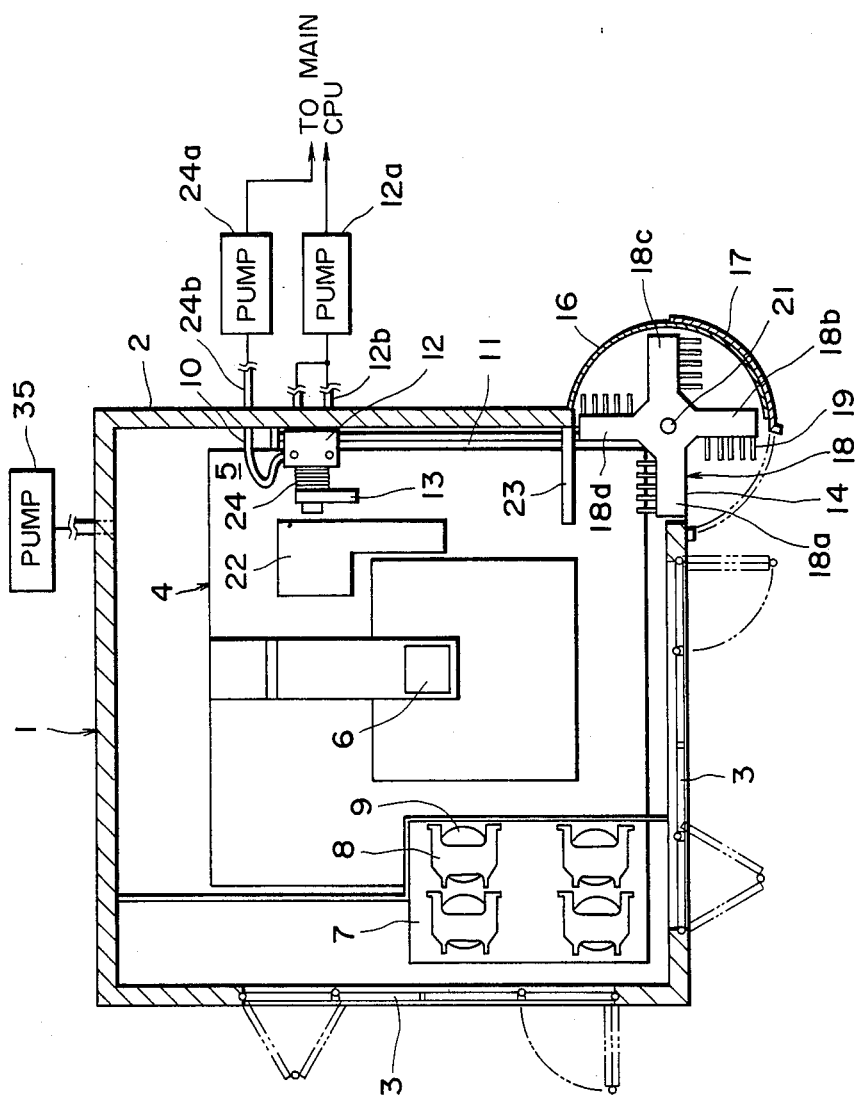
FIG. 1 is a plan view of a chamber in which an exposure apparatus having a mask storing system according to a first embodiment of the present invention is disposed.
Figure 2:
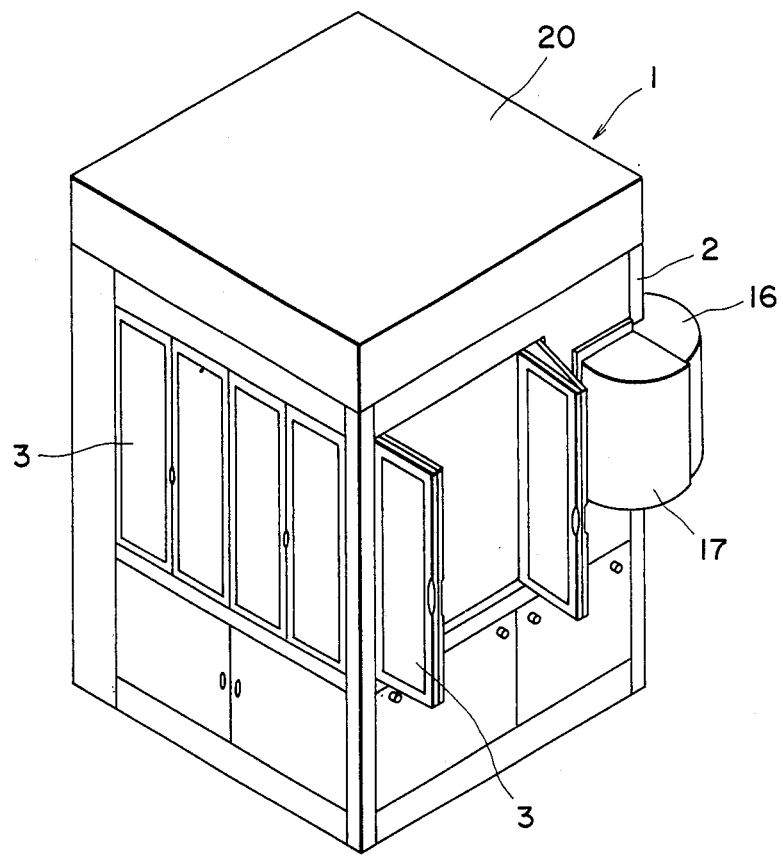
FIG. 2 is a perspective view of the chamber shown in FIG. 1.
Figure 3A:
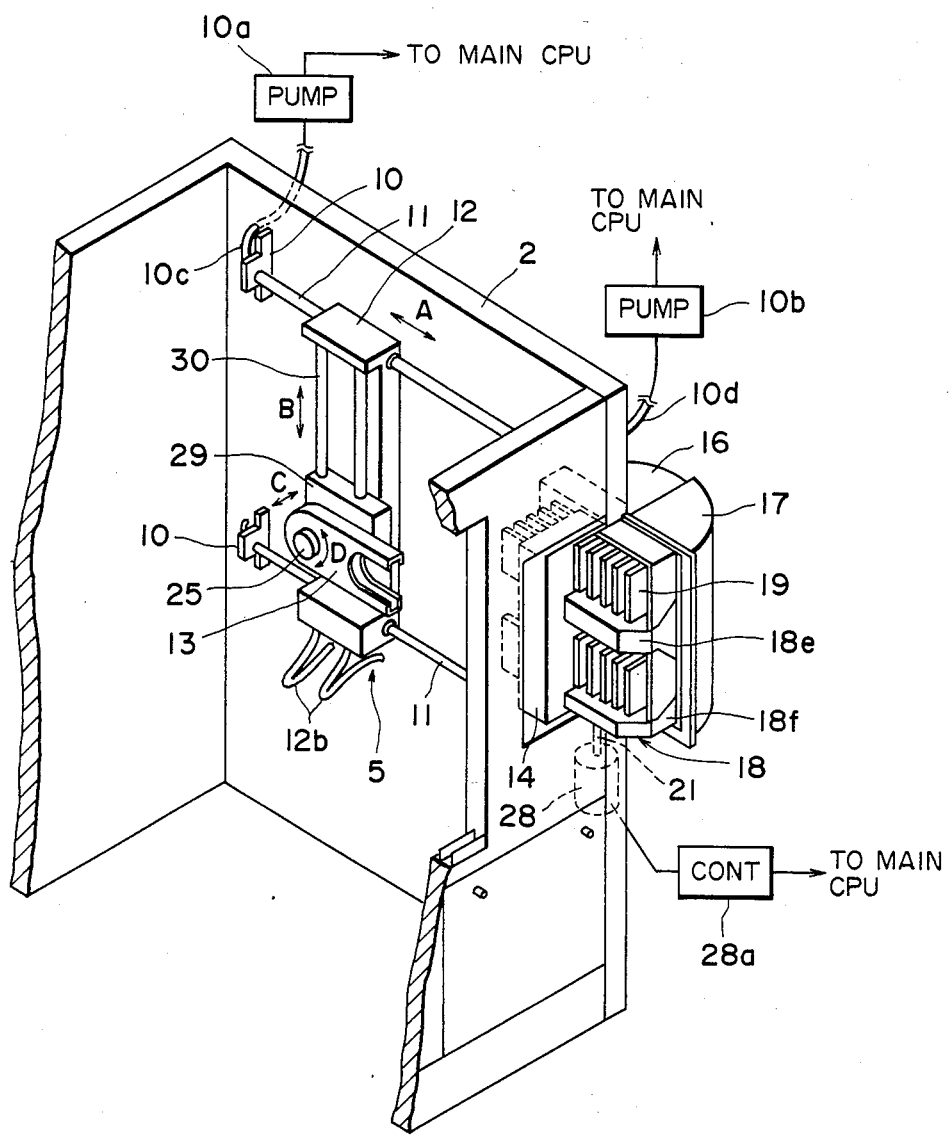
FIG. 3A is a fragmentary perspective view showing a mask conveying mechanism disposed within the chamber of FIG. 1.

Referring first to FIGS. 1-3A, a chamber 1 accommodates an exposure apparatus having a mask storing system according to a first embodiment of the present invention. The chamber 1 has side walls 2 and doors 3 provided at entrances formed in portions of the side walls 2. These entrances are provided for the sake of an operator's access to the exposure apparatus. The top of the chamber 1 is covered by a top wall 20 (FIG. 2). The exposure apparatus generally denoted at 4 and a mask conveying device generally denoted at 5 are disposed in the chamber 1. Disposed on a wafer carrying table 7 are plural wafer cassettes 8 in each of which plural wafers 9 are kept in a stacking fashion. These wafers are supplied one by one to the exposure station 6 by means of a wafer supplying mechanism, not shown. As is best seen in FIG. 3A, the conveying device 5 includes guide rails 11 extending horizontally and fixedly secured by brackets 10 to the inner surface of the side wall 2 of the chamber 1; a carrier 12 slidably mounted on the guide rails 11, the carrier 12 being movable in the direction of an arrow A; a slider 29 mounted on the carrier 12 by means of guide rails 30 and being movable vertically (upwardly/downwardly) as denoted by an arrow B; and a hand 13 mounted on the slider 29. The hand 13 is movable in the direction of an arrow C which is perpendicular to the inner surface of the side wall 2 on which the conveying device is mounted. Also, the hand 13 is rotatable as denoted by an arrow D about a shaft 25 mounted on the slider 29 and extending perpendicular to the side wall 2 on which the conveying device is mounted.

Figure 3B:
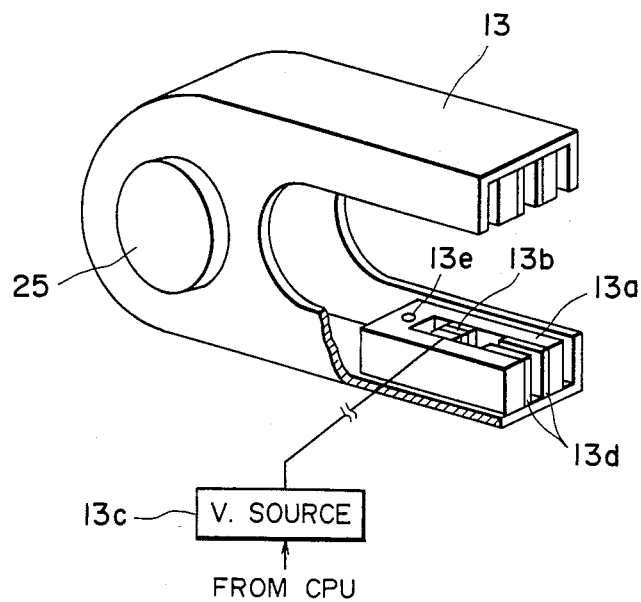
FIG. 3B is an enlarged perspective view of a hand of the mask conveying mechanism shown in FIG. 3A.

The hand 13 is illustrated in detail in an enlarged view of FIG. 3B. As shown, the hand 13 has a generally U-shape and has two generally channel-shaped reticle gripping members 13a. Each of these reticle gripping members 13a has two opposed fingers and two opposed rubber pads 13d adhered to end portions of the fingers. When one of reticles, which will be described later, is to be gripped, it is introduced into the space between the opposed rubber pads 13d and sandwiched therebetween. A piezoelectric device 13b is disposed between the opposed fingers of each of the reticle gripping members 13a. The piezoelectric device 13b is arranged to expand when an electric voltage is applied thereto from a voltage source 13c, to thereby expand the space between the opposed fingers of the reticle gripping members 13a. This allows easy insertion and release of the reticle into and from the hand 13. The application of the voltage to each of the piezoelectric devices 13b from the voltage source 13c is controlled under the influence of a main central processing circuit 121 (FIG. 4) which will be described later. After insertion/release of the reticle into/from the hand 13, the piezoelectric devices 13b are de-energized. The portion of each reticle gripping member 13a, connecting the fingers, is secured to the frame of the hand 13 by means of a pin 13e.

Figures 3C, 3D:
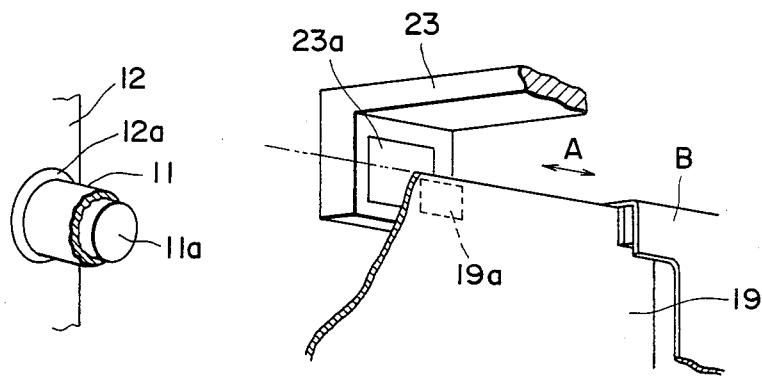
FIG. 3C is a fragmentary perspective view showing the structure of a guide rail used in the mechanism of FIG. 3A.
FIG. 3D is a fragmentary perspective view showing a bar-code reader used in the present invention.

As shown in FIG. 3C, each of the guide rails 11 comprises a cylindrical member in which a magnetic piston 11a is loosely received. The upper guide rail 11 has opposite ends which are in communication with pumps 10a and 10b, respectively, by means of respective tubes 10c and 10d. By supplying suitable air pressures to the opposite sides of the piston 11a from the pumps 10a and 10b, the piston 11a is driven and moved along the inner cylindrical surface of the guide rail 11. The carrier 12 has upper and lower sliding portions 12a, only one of which is illustrated in FIG. 3C. Each of the sliding portions 12a has a cylindrical shape slidably receiving corresponding one of the guide rails 11. Each sliding portion 12a has a magnetic portion which is adapted to be attracted to the piston 11a disposed within the guide rails 11. Thus, when the piston 11a moves within the guide rail under the influence of the air pressures supplied from the pumps 10a and 10b, the carrier 12 follows the movement of the piston 11a. Although only two pumps 10a and 10b are illustrated, another pair of similar pumps are provided which are in communication with the opposite ends of the lower guide rail 11.

In order to displace the slider 29 in the opposite directions denoted by the arrow B, each of the guide rails 30 is formed by a cylindrical element having a magnetic piston, like the piston 11a, disposed therewithin. The lower ends of the guide rails 30 are in communication with a common air pump 12a (FIG. 1) by way of tubes 12b. Thus, the pistons in the guide rails 30 are driven under the influence of air pressures supplied thereto from the air pump 12a, in a similar manner as described with reference to the pistons 11a. Also, similarly, the slider 29 follows the movement of the pistons which move within the guide rails 30. A bellow 24 is provided between the slider 29 and the hand 13. A piston mechanism, not shown, is disposed within this bellow 24, the piston mechanism being arranged to displace the hand 13 relative to the slider 29 in a direction perpendicular to the side wall 2 on which the conveying device is mounted. The piston mechanism for moving the hand 13 has a similar structure to that described and is driven by an air pressure supplied thereto from a pump 24a (FIG. 1) by means of a tube 24b. While not shown in the drawings, the hand 13 is provided with a pulse motor for rotating the hand 13 in the directions denoted by an arrow D about the shaft 25. The actuation of this pulse motor and the pump 24a is controlled by the main central processing unit 121 (FIG. 4) so as to move the hand 13 to a desired position and orientation.

In the course of the path of movement of the carrier 12, a bar-code reader 23 is provided to read a bar code which is formed on each of the reticles, when it is conveyed by the carrier 12. The reader 23 may comprise a mark reader using a charge coupled device (CCD) or an optical character reading device. At an end portion of the path of movement of the carrier 12, an inspecting device 22 is provided for inspecting undesirable adhesion of dust or foreign particles onto the reticle.

At a corner of the chamber 1 defined by two adjacent side walls 2, an opening 14 for allowing the introduction of masks is formed. A rotatable mask shelf 18 is rotatably mounted in this opening 14. More particularly, the rotatable mask shelf 18 is rotatably supported on the side wall of the chamber 1 by means of a rotational shaft 21. The mask shelf 18 has four support walls 18a–18d which extend radially outwardly from the central shaft 21 so that the shelf 18 has a cross-shape in section, as is best seen in FIG. 1. Each of the support walls 18a–18d has two reticle carrying tables 18e and 18f which are mounted on one of the surfaces of the support wall at upper and lower positions thereof. As is best seen in FIG. 3A, a number of reticles 19 are carried on each of these carrying tables. Each of the support walls 18a–18d has a shape and dimensions which coordinates with the opening 14 of the chamber 1 so that it rotationally moves from the outside to the inside of the chamber and from the inside to the outside of the chamber. The portion of the rotatable shelf 18 which protrudes beyond the side wall of the chamber 1 to the outside thereof, is covered by a semi-cylindrical casing 16 and a door 17 of similar shape which is slidable along the casing 16 (FIG. 2).

When, in operation, a particular reticle is designated by the operator's typing on a keyboard 144 (FIG. 4), the main central processing unit 121 (hereinafter "main CPU") produces an instruction signal which is supplied to a motor controlling circuit 28a. The controlling circuit 28a is electrically connected to a pulse motor 28 for rotating the rotatable shelf 18, so that, in accordance with the instruction signal supplied from the main CPU 121, it drives the motor 28 to rotate the shelf 18 by a suitable amount. By this means, a particular reticle carrying table carrying the designated reticle is brought to a position facing the interior of the chamber 1. Thereafter, the conveying device 5 is actuated so as to move the hand 13 to a position facing the designated reticle. Then, the carrier 12 is slidingly moved along the guide rails 11 in the direction denoted by arrow A thereby to move the hand 13 to the shelf 18 position and to thereby take out the designated reticle from the reticle carrying table. The thus chosen reticle is conveyed to the inspecting device 22.

As described in the foregoing, each of the reticles 19 has a bar code as an identification mark, preparatorily formed thereon. Preferably, such identification mark is formed on a portion of the reticle, such as a frame portion, that does not have an adverse effect upon a circuit pattern or alignment marks of the reticle. Also, in this embodiment, for every one of the reticles, information related to inherent operational parameters necessary for controlling the pattern transfer operation using the one reticle has preparatorily been stored into an external memory. The information related to the operational parameters corresponding to a designated reticle is read out of the external memory in response to detection of the identification mark of the designated memory at the bar-code reader 23, and then is supplied to the main CPU 121. Since, in this embodiment, the identification mark is used to designate the relation between a selected reticle and corresponding operational parameters stored in the external memory, it may be formed by numerals, letters, etc.

In the course of conveyance of the selected reticle from the reticle carrying table to the inspecting device 22, the movement of the hand 13 is temporarily stopped and the identification mark of the reticle is read by the reader 23. By this means, whether or not the selection is correct is discriminated. FIG. 3D shows the positional relation between the identification mark of the reticle and a detecting portion of the reader 23. The conveying device 5 operates to move the reticle 19 to a position at which the identification mark 19a of the reticle 19 is opposed to the mark detecting portion 23a of the reader 23. The detecting portion 23a comprises a light source, a scanning optical system for scanning the bar code with light from the source, and a photodetector for detecting light reflected from the bar code, all of which are not shown in the drawings. A mark detection signal from the photodetector is supplied to the main CPU 121, whereby the selected reticle is discriminated.

After discrimination, the reticle is conveyed to the inspecting device 22. During such conveyance, the hand 13 may be rotated so that its reticle gripping side faces upwardly thereby to positively prevent fall of the reticle. If adhesion of dust or foreign particles to the reticle is detected at the inspecting device 22, they are removed by use of suitable cleaning means. Thereafter, the reticle is held by a chuck of a reticle conveying hand, not shown, and is transferred from the hand 13 to a predetermined position close to the exposure station 6. After completion of the exposure process to the wafers of a predetermined number, the reticle is returned by the unshown reticle conveying hand to the hand 13, so that it is conveyed back to the rotational shelf 18 and returned to the corresponding reticle carrying table.

Replacement of one or more reticles contained in the rotational shelf 18 or supply of one or more reticles into the rotational shelf 18 is exeucted by an operator from the outside of the chamber. That is, the operator slides a door 17 to open the same (see FIG. 1). By this means, one of the support walls (18b in FIG. 1 example) is exposed to the outside of the chamber. Thus, the operator can easily access to the reticles carried on the reticle carrying tables of the exposed support wall, such that replacement of reticles or supply of additional reticles can be achieved easily, without the necessity of the operator entering into the chamber from the entrance. At this time, almost all the area of the opening 14 of the chamber wall is closed by an adjacent supporting wall (18a in FIG. 1 example) of the rotational shelf 18. Further, in this embodiment, a pump 35 is provided to supply air pressure into the chamber 1. That is, by use of this pump 35, a positive pressure (a slightly higher pressure) is maintained within the chamber 1 as compared with the pressure in the outside thereof, at least when the door 17 is opened. This is very effective to prevent dust or foreign particles from entering into the chamber 1 through the gap between the side wall 2 and the support wall 18a for example.

Figure 4:
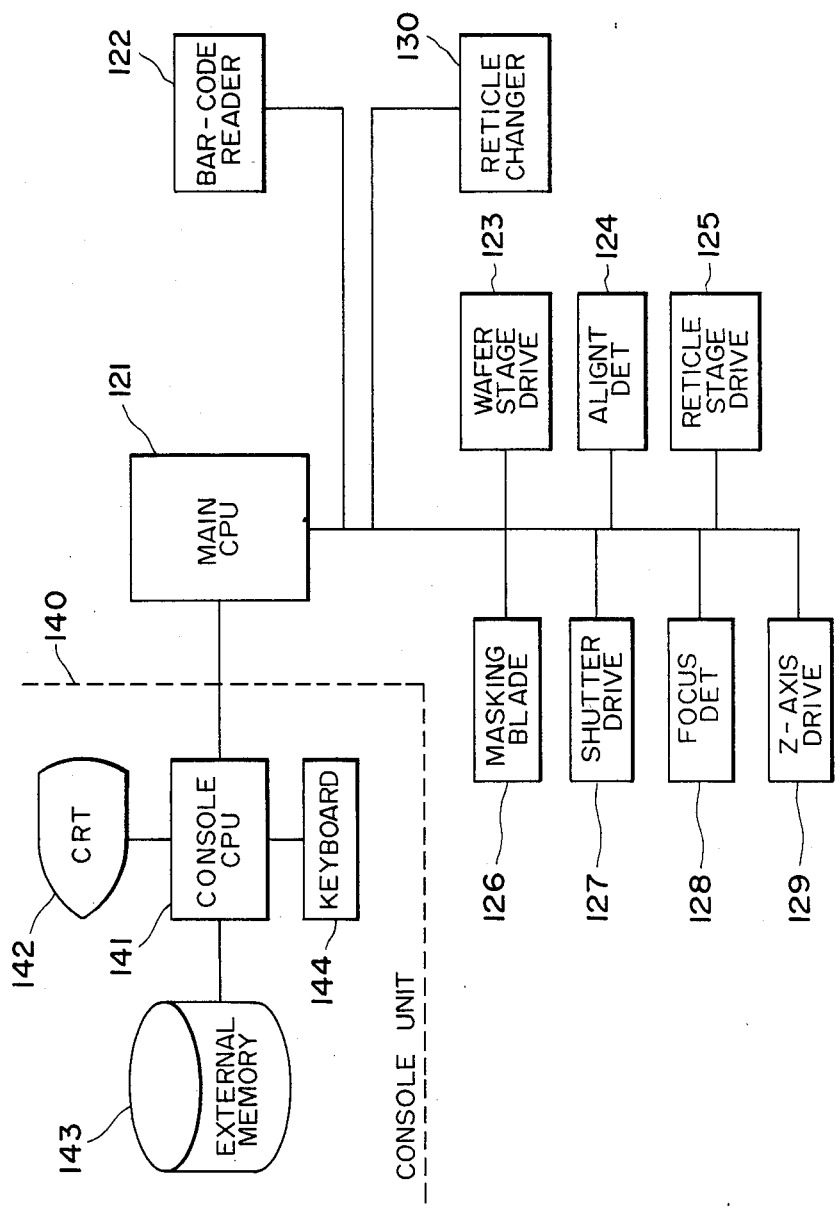
FIG. 4 is a diagram showing a control system of the exposure apparatus having a mask storing system of the present invention.

FIG. 4 shows a control system for controlling the operation of the exposure apparatus as a whole. The main CPU 121 comprises a microcomputer or minicomputer arranged to control various operations to be made in the apparatus. Denoted in this Figure by numeral 123 is a wafer driving unit; by 124, an alignment detecting system; by 125, a reticle stage driving unit; by 126, a masking blade unit; by 127, a shutter driving unit; by 128, a focus detecting system; and by 129, a Z-axis driving unit. These components are controlled under the influence of the main CPU 121. Denoted by numeral 130 is a reticle changer comprising the reticle conveying device 5 and the like; and by 140, a console unit which is arranged to supply to the main CPU 121 various information signals or parameters related to the operations to be made in the exposure apparatus. The console unit 140 comprises a console central processing unit 141 (hereinafter "console CPU"), a console cathode ray tube 142 which is a monitoring TV receiver, an external memory 143 for storing therein various operational parameters and so on, and a keyboard 144 provided to input various operational instructions or parameters into the apparatus.

Where the operational parameters are to be changed in response to replacement of reticles, the main CPU 121 produces an instruction signal, instructing reticle replacement, and supplies it to the reticle changer 130. The reticle changer 130 comprises the conveying device 5, the rotational shelf 18 and their cooperative components. In response to signal application, the reticle changer 130 is operated to move any reticle, when it is on the reticle stage, back to a corresponding reticle cassette and picks up a designated reticle from its cassette and then conveys the same to the reticle stage. During this conveyance, the main CPU 121 detects an identification mark of the selected reticle with the aid of the bar-code reader 23. Also, the main CPU 121 acts on the console CPU 141 to cause it to read out the information related to the operational parameters corresponding to the detected identification mark out of the external memory 143, whereby the information related to the necessary operational parameters is obtained. The thus obtained information related to the operational parameters is transmitted to controllers for the peripheral systems. For example, the information related to the position of masking blades is supplied to the masking blade unit 126. Also, the information related to the position of alignment marks, it is transmitted to the alignment detecting system. In this manner, the operational parameters corresponding to the selected reticle are set in appropriate portions of the apparatus. After completion of conveyance of the selected reticle, the exposure operation starts.

As the external memory, in the present embodiment, suitable memory means is annexed to the console CPU and the information related to the operational parameters are supplied to the main CPU by way of the console CPU. However, any other means may be used provided that the operational parameters corresponding to the detected identification mark can be set thereby. For example, suitable external memory means, a random access memory (RAM), a read only memory (ROM), etc. having a table concerning the correspondence between identification marks and operational parameters, may be directly annexed to the main CPU.

Figure 5:
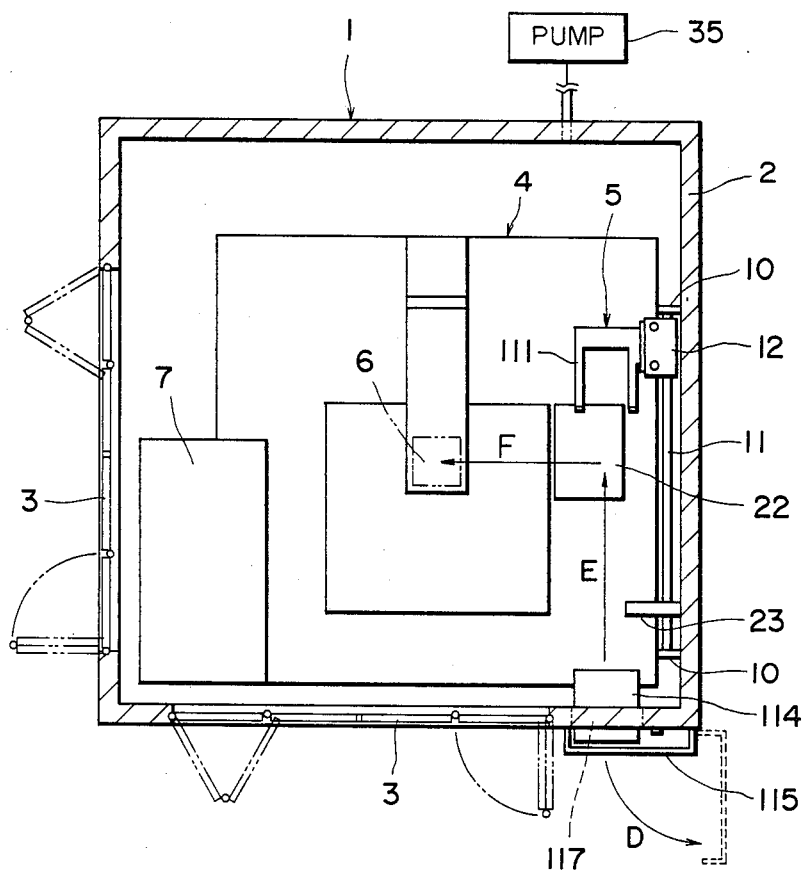
FIG. 5 is a plan view of a chamber in which an exposure apparatus having a mask storing system according to a second embodiment of the present invention is disposed.
Figure 6:
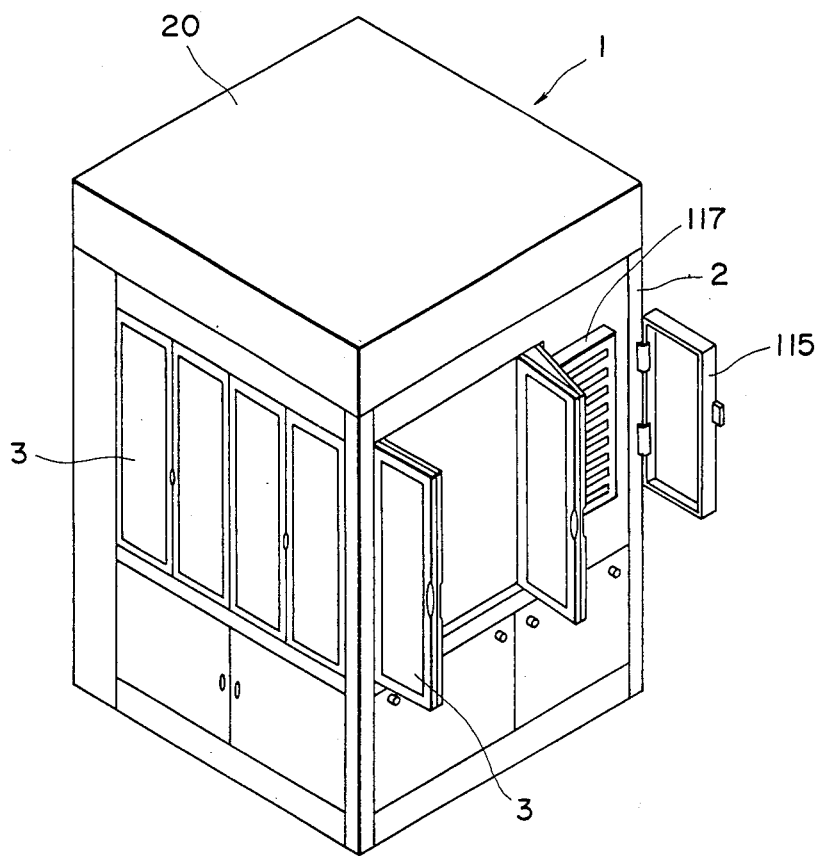
FIG. 6 is a perspective view of the chamber shown in FIG. 5.
Figure 7:
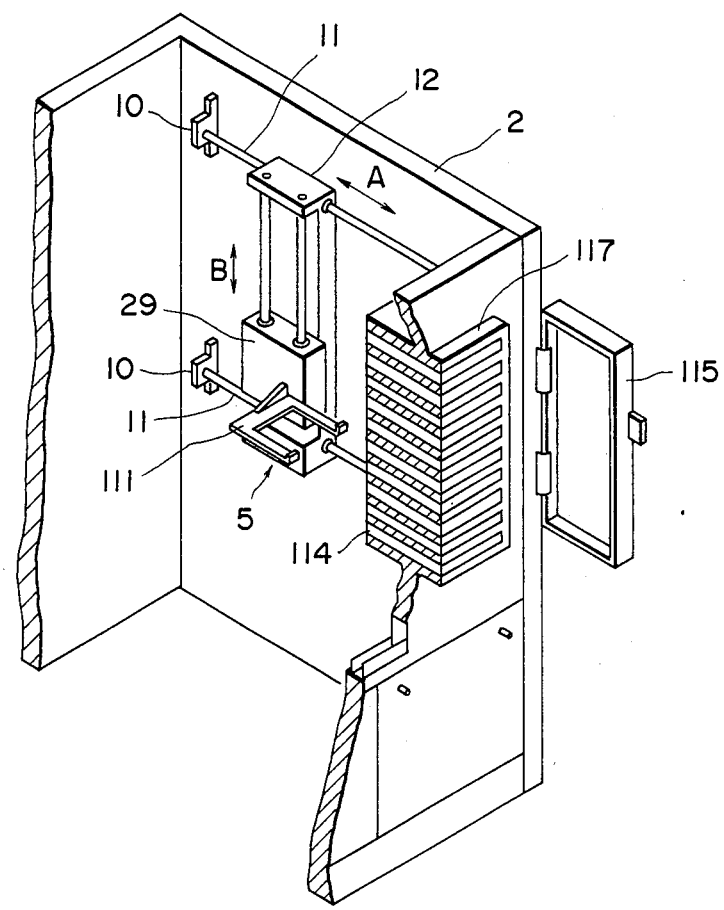
FIG. 7 is a fragmentary perspective view showing the structure of the mask storing system of the present invention.

Referring now to FIGS. 5–7, another embodiment of the present invention will be described. Like numerals as those in the preceding embodiment are assigned to corresponding elements.

As illustrated, a chamber 1 has side walls 2 and entrances, defined therein, which are normally closed by doors 3. The top of the chamber 1 is covered by a top wall 20. An exposure apparatus generally denoted at 4 and a conveying device generally denoted at 5, are housed in the chamber 1. Plural wafer cassettes, not shown, each holding plural wafers are disposed on a wafer carrying table 7 of the exposure apparatus 4. The wafers are taken out from the wafer cassettes, one by one, and supplied to an exposure station 6 by means of a wafer supplying mechanism, not shown. The conveying device 5 which is one of the components of the reticle changer comprises, as shown in FIG. 7, upper and lower guide rails 8 extending horizontally and fixedly secured, by means of brackets 10, to an inner surface of one of the side walls of the chamber 1; a carrier 12 which is made slidable along the guide rails 11 in directions denoted by an arrow A; a slider 29 mounted on the carrier 12 and being movable vertically (upwardly and downwardly) as denoted by an arrow B; and a hand 111 provided on the slider 29. The carrier 12 and slider 29 are driven in a similar manner as has been described with reference to the first embodiment. In the course of path movement of the carrier 12, a bar-code reader 23 is provided so as to read or detect an identification mark of a reticle when it is conveyed thereto. Also, at the end portion of the path of movement of the carrier 12, an inspecting device 22 for detecting adhesion of dust or foreign particles onto the reticle is provided.

Figures 8, 9:
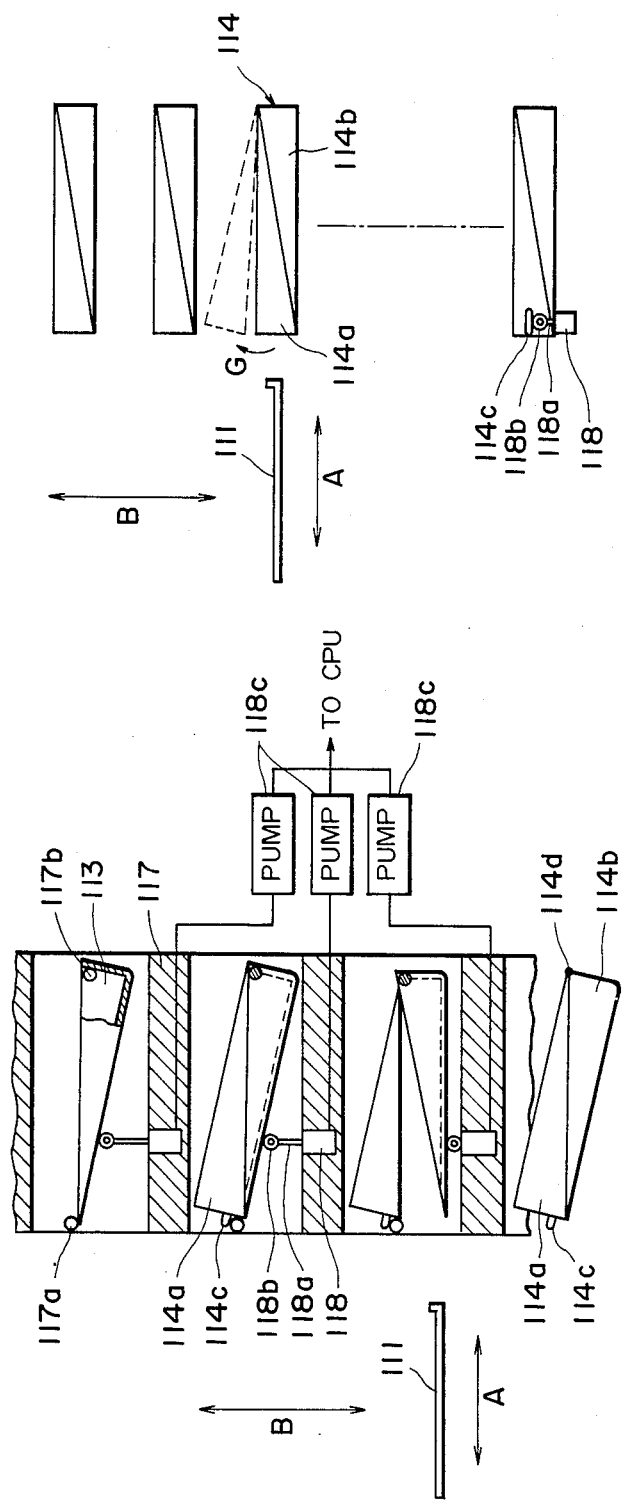
FIG. 8 is a sectional view schematically showing an example of mask-cassette storing state in the mask storing system according to the present invention.
FIG. 9 is a schematic view showing another example of mask-cassette storing state in the mask storing system according to the present embodiment.

In one of the side walls 2 of the chamber 1, an opening 117 is formed in which a reticle cassette shelf having a casing and a number of partition walls are disposed. The partition walls of the shelf are disposed at a constant vertical interval so that they are stacked at constant intervals. These intervals between the partition walls provide cassette inserting openings. When reticle cassettes 114 such as shown in FIG. 8 or 9 are introduced into the cassette shelf, each of the cassettes 114 is supported by the side wall of the cassette shelf. The opening 117 in which the cassette shelf is received is normally covered by a hinged door 115.

Referring now to FIGS. 8 and 9, the manner of introduction of the cassettes into the shelf and the manner of extracting reticles from the reticle cassettes will be described. FIG. 8 is a fragmentary side sectional view of the cassette shelf and, in this Figure, three cassette receiving openings are illustrated. The uppermost opening is illustrated as being representative of a "vacant" state (i.e. no cassette is loaded). The middle opening is illustrated as being representative of a reticle storing state in which a reticle is contained in a closed cassette. The lowermost opening is illustrated as being representative of a reticle loading/unloading state in which the cassette is opened to allow insertion/extraction of a reticle into or from the cassette. The lowermost portion of FIG. 8 shows the orientation of the reticle cassette when it is kept in the cassette shelf. As shown, each of the reticle cassettes 114 has a box-like shape and comprises a tray member 114b for receiving one reticle and a cover member 114a formed so as to cooperate with the tray member 114b to define a substantially closed package. The tray member 114b and the cover member 114a are swingable about an axis 114d extending in the direction perpendicular to the sheet of the drawing, relative to each other. For example, a hinge mechanism is provided at the position of the axis 114d. When the cover member 114a is rotationally moved relative to the tray member 114b about the axis 114d, an opening is defined at a side of the cassette 114 which faces to the interior of the chamber 1.

The cover member 114a has a protrusion 114c such as shown in FIG. 8. On the other hand, a cassette supporting member 113 is provided within each of the cassette inserting openings 117, such as shown in the uppermost portion of FIG. 8. These cassette supporting members 113 are rotatably supported by shafts 117b mounted on the side wall of the shelf. Thus, each of the cassette supporting members 113 is rotatable about a corresponding one of the shafts 117b. Also, as shown in the uppermost portion of FIG. 8, the cassette supporting member 113 has a recess-like shape, facing upwardly. The reticle is placed on the bottom of the cassette supporting member 113, such as shown in the middle opening of the shelf in FIG. 8. By this, the cassette 114 is supported.

Disposed in each of the cassette inserting openings and underneath the cassette supporting member 113, is a piston-cylinder mechanism 118 which is in communication with corresponding one of air pumps 118c. When air pressure is supplied from one of the air pumps 118c to a corresponding piston-cylinder mechanism 118, a rod 118a thereof is lifted upwardly. The rod 118a has a roll 118b mounted on a tip end thereof. Thus, the rod 118a is effective to lift up, by way of the roll 118b, the cassette supporting member 113 in a rotational direction about the shaft 117b. When the cassette 114 is to be closed to keep a reticle therein, a suitable one of the air pumps 118c supplies the air pressure so as to move corresponding one of the cassette supporting members 113 to a position as illustrated in the middle opening of the shelf shown in FIG. 8. At this time, the protrusion 114c of the cassette 114 engages with a protrusion 117a formed on the side wall of the opening 117. When, on the other hand, the cassette 114 is to be opened, the air pressure is released from the piston-cylinder assembly so that the rod 118a moves downwardly. By this means, the cassette supporting member 113 moves to a position shown in the lowermost opening of the shelf in FIG. 8. As the cassette supporting member 113 moves, the tray member 114b of the cassette swings counterclockwise about the axis 114d and assumes the position denoted by a broken line in FIG. 8. At this time, the protrusion 114c of the cover member 114a is blocked by the protrusion 117a. Therefore, the cover member 114a is retained substantially immovable. In this manner, the cassette 114 is brought into a position such as shown in the third opening of the shelf in FIG. 8. That is, the cassette opens. The actuation of each of the pumps 118c is controlled under the influence of the main CPU 121.

When the cassette opens, the hand 111 of the reticle changer is moved to take out the reticle contained in the cassette. For this purpose, the hand 111 enters into a gap defined between the upper surface of the tray member 114b and the lower surface of the reticle.

In place of inclined disposition shown in FIG. 8, horizontal disposition such as shown in FIG. 9 may be used. More particularly, each of the reticle cassettes 114 is simply placed on corresponding one of the horizontal partition walls of the cassette shelf. In the example of FIG. 9, to extract the reticle, the cover member 114a of the cassette 114 is moved upwardly by use of a similar piston-cylinder mechanism 118 whose rod engages with the protrusion 114c. By this means, the front side of the cassette is opened to allow insertion of the hand 111 into the cassette for extraction of the reticle.

When a particular reticle is designated in accordance with the pattern to be used, the conveying device 5 is actuated under the control of the main CPU 121 so that first the hand 111 is moved to the height corresponding to the position of a particular cassette containing the designated reticle. Then, the thus designated reticle cassette is opened while, on the other hand, the carrier 12 slidingly moves toward the designated cassette so that the hand 111 carries and takes out the designated reticle from the cassette. The reticle now carried on the hand 111 is conveyed in the direction of an arrow E (FIG. 5) to the inspecting device 22. If adhesion of dust or foreign particles onto the reticle is detected, they are removed by suitable cleaning means. In the course of conveyance of the reticle by the hand 111, an identification mark (bar code) of the reticle is read by the bar-code reader 23 and, whereby, whether or not the selection is correct is discriminated. After the inspection at the inspecting device 22, the reticle is gripped by a chuck, not shown, and is conveyed to the exposure station 6 such as illustrated by an arrow F. After completion of the exposure process to wafers of a predetermined number, the reticle is conveyed by the hand 111 back to the reticle cassette, in which it had been stored.

For replacement of one or more reticle cassettes 114, the door 115 is opened in the direction of an arrow D (FIG. 5). Then, the operator takes out reticle cassettes 114 containing reticles to be replaced, and insert new reticle cassettes containing reticles to be newly used. At this time, in the present embodiment, a pump 35 supplies an air pressure into the chamber 1 so as to maintain a positive pressure (slightly higher pressure) in the chamber 1 as compared with the pressure in the outside of the chamber. This effectively prevents dust or foreign particles from entering into the chamber through a gap between the side wall 2 and the reticle cassettes.

While the invention has been described with reference to the structures disclosed herein, it is not confined to the details set forth and this application is intended to cover such modifications or changes as many come within the purposes of the improvements or the scope of the following claims.

What is claimed is:

1. A device for supplying masks to be used in a chamber, said device comprising:
a wall for defining a boundary of the chamber, wherein said wall has an opening formed therein; and
a rotatable shelf disposed in said opening and for carrying thereon the masks;
a rotatable shaft, for coupling said rotatable shelf to a portion of the wall adjacent to the opening, and wherein said rotational shelf has a mask carrying portion which is rotationally movable about said rotational shaft through the opening to and from the inside of the chamber and from and to the outside of the chamber;

conveying means supported on an inner surface of said wall for conveying a selected one of the masks carried on said rotatable shelf, wherein said conveying means comprises:
    a guide rail extending horizontally and being secured to said inner surface of said wall;
    a carrier slidably movable along said guide rail; and
    a hand mounted on said carrier for movement in a direction perpendicular to the carrier and in a direction perpendicular to said wall on which said conveying means is mounted.

2. A device according to claim 1, wherein said rotatable shelf includes a plurality of support walls extending radially outwardly from said rotational shaft, and a plurality of mask carrying table mounted on one of surfaces of each of said supporting walls.

3. A device according to claim 2, wherein said supporting walls extend in four radial directions so that said rotational shelf has a substantially cross-shape in section.

4. A device according to claim 2, wherein each of said supporting walls has two mask carrying tables which are spaced from each other with respect to a vertical direction.

5. A device for supplying masks to be used in a chamber, said device comprising:
    a wall for defining a boundary of the chamber, wherein said wall has an opening formed therein; and
    a cassette carrying member disposed adjacent to the opening in said wall for carrying thereon a plurality of cassettes each for containing a mask;
    wherein said cassette carrying member includes a plurality of cassette inserting openings which are positioned at predetermined intervals with respect to the vertical direction, for receiving the cassettes; and
    a hinged door provided on a surface of said wall, wherein said cassette inserting openings are normally closed by said hinged door.

6. A device according to claim 5, wherein said carrying member includes means for opening/closing each of the mask cassettes.

7. In a device for handling a plate-like member, for use in an exposure apparatus having an exposure system accommodated in a chamber, the improvement comprising:
    a wall for defining a boundary of the chamber, wherein said wall has an opening formed therein;
    a holder for holding the plate-like member and being supported at said opening by the chamber, said holder being adapted to hold the plate-like member so that at least a portion of the plate-like member is positioned within the chamber;
    a cover member provided at said opening to cover said opening so that the inside of the chamber is substantially isolated from the outside of the chamber when said holder is placed in the inside of the chamber, said cover member being movably supported by said chamber so as to be alternately opened and closed; and
    conveying means for conveying the plate-like member between said holder and the exposure system, said conveying means comprising a hand operable to extract the plate-like member from said holder and to return the plate-like member back to said holder when the plate-like member is moved back from the exposure system.

8. A device according to claim 7, wherein said holder comprises a cassette and wherein the plate-like member is held by said cassette of said holder.

9. A device according to claim 7, wherein said hand is supported by the chamber so that said hand is placed on the inside of the chamber.

* * * * *

UNITED STATES PATENT AND TRADEMARK OFFICE
CERTIFICATE OF CORRECTION

PATENT NO.    : 4,757,355
DATED         : July 12, 1988
INVENTOR(S)   : KAZUO IIZUKA, ET AL.

It is certified that error appears in the above-identified patent and that said Letters Patent is hereby corrected as shown below:

COLUMN 1

Line 40, "inpurity" should read --impurity--.

COLUMN 4

Line 62, "way" should read --means--.
   Line 68, "bellow 24" should read --bellows 24--.

COLUMN 5

Line 2, "bellow 24," should read --bellows 24,--.

COLUMN 6

Line 56, "exeucted" should read --executed--.

COLUMN 7

Line 57, "marks, it" should read --marks--.

COLUMN 10

Line 39, "insert" should read --inserts--.
   Line 51, "many" should read --may--.

UNITED STATES PATENT AND TRADEMARK OFFICE
CERTIFICATE OF CORRECTION

PATENT NO. : 4,757,355

DATED : July 12, 1988

INVENTOR(S) : KAZUO IIZUKA, ET AL.

It is certified that error appears in the above-identified patent and that said Letters Patent is hereby corrected as shown below:

COLUMN 11

Line 15, "table" should read --tables--.

Signed and Sealed this

Twenty-third Day of May, 1989

Attest:

DONALD J. QUIGG

*Attesting Officer*

*Commissioner of Patents and Trademarks*